(12) United States Patent
Jech, Jr. et al.

(10) Patent No.: US 6,284,560 B1
(45) Date of Patent: Sep. 4, 2001

(54) METHOD FOR PRODUCING CO-PLANAR SURFACE STRUCTURES

(75) Inventors: Joseph Jech, Jr., Rochester; John A. Lebens, Rush; John C. Brazas, Jr., Hilton, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/215,973

(22) Filed: Dec. 18, 1998

(51) Int. Cl.[7] ................................................. H01L 21/302
(52) U.S. Cl. ............................................. 438/48; 438/692
(58) Field of Search ...................... 216/2, 88, 89, 216/39; 438/488, 692, 693, 959, 974, 946, 48

(56) References Cited

U.S. PATENT DOCUMENTS

| | | | |
|---|---|---|---|
| 602,265 | * | 2/1900 | Lou ........................................ 438/692 |
| 4,789,648 | | 12/1988 | Chow et al. . |
| 4,944,836 | | 7/1990 | Beyer et al. . |
| 4,954,142 | | 9/1990 | Carr et al. . |
| 5,311,360 | | 5/1994 | Bloom et al. . |
| 5,663,107 | * | 9/1997 | Peschke et al. ....................... 438/692 |
| 5,721,172 | | 2/1998 | Jang et al. . |
| 5,804,084 | | 9/1998 | Nasby et al. . |
| 5,904,558 | * | 5/1999 | Guzuki et al. ....................... 438/692 |
| 5,923,993 | * | 7/1999 | Sahota ................................... 438/692 |
| 5,948,698 | * | 9/1999 | Inohara et al. ....................... 438/692 |
| 5,948,700 | * | 7/1999 | Zheng et al. ......................... 438/692 |
| 5,958,795 | * | 9/1999 | Chen et al. ........................... 438/692 |
| 5,976,982 | * | 11/1999 | Levy et al. ........................... 438/692 |
| 5,988,713 | * | 5/1999 | Acocella et al. ..................... 438/201 |
| 6,001,730 | * | 12/1999 | Farkas et al. ........................ 438/692 |
| 6,004,653 | * | 12/1999 | Lee et al. ............................. 438/692 |
| 6,017,803 | * | 1/2000 | Wong ................................... 438/692 |
| 6,022,788 | * | 2/2000 | Gandy et al. ........................ 438/692 |
| 6,033,961 | * | 3/2000 | Xu et al. .............................. 438/692 |
| 6,048,771 | * | 4/2000 | Lin et al. .............................. 438/692 |
| 6,093,631 | * | 7/2000 | Jaso et al. ............................ 438/692 |

OTHER PUBLICATIONS

B. H. Roh et al., "Easily Manufacturable Shallow Trench Isolation for Gigabit Dynamic Random Access Memory", *Jpn. J. Appl. Phys.*, vol. 35, 1996, Pt. 1, No. 9A, pp. 4618–4623.

* cited by examiner

*Primary Examiner*—Savitri Mulpuri
(74) *Attorney, Agent, or Firm*—Thomas H. Close; Stephen H. Shaw (57) ABSTRACT

A method for producing co-planar surface areas is disclosed. At first a first layer with at least one recess is provided. Onto the first layer a second layer is deposited over the entire area of the first layer wherein the second layer has a thickness greater than the depth of the recess. The second layer is composed of material different to the material of the first layer. The next step removes the second layer completely beyond the area of at least one recess. The remaining portion of the second layer is removed until the second layer is coplanar with the first layer.

6 Claims, 10 Drawing Sheets

METHOD FOR PRODUCING CO-PLANAR SURFACE STRUCTURES

CROSS REFERENCE TO RELATED APPLICATIONS

Reference is made to U.S. Ser. No. 09/216,374 filed concurrently, entitled An Electro-Mechanical Grating Device; and to U.S. Ser. No. 09/216,202, filed concurrently, entitled Process For Manufacturing An Electro-Mechanical Grating Device; and to U.S. Ser. No. 09/216,375, filed concurrently, entitled A Multilevel Electro-Mechanical Grating Device.

FIELD OF THE INVENTION

The invention relates to a method for producing co-planar surface structures. More particular, the invention relates to a method for producing co-planar surface structures which are used as a basis for the formation of additional structural elements having flat surfaces over a wide range.

BACKGROUND OF THE INVENTION

Advances in micromachining technology have given rise to a variety of Micro-electromechanical systems (MEMS) including light modulators for low cost display applications. Such modulators provide high-resolution, high operating speeds (kHz frame rates), multiple gray scale levels, color adaptability, high contrast ratio, and compatibility with VLSI technology. One such modulator has been disclosed in U.S. Pat. No. 5,311,360, issued May 10, 1994 to Bloom et al., entitled "Method and Apparatus for Modulating a Light Beam". This modulator is a micromachined reflective phase grating. It consists of a plurality of equally spaced deformable elements in the form of beams suspended at both ends above a substrate thereby forming a grating. The deformable elements have a metallic layer that serves both as an electrode, and as reflective surface for incident light. The substrate is also reflective and contains a separate electrode. The disclosure in U.S. Pat. No. 5,311,360 is silent about the efficiency decrease of the device if not all the beams of the device do not have a completely flat surface and the same cross section.

As disclosed in U.S. Ser. No. 90/216,202, entitled "Process for Manufacturing an Electro-Mechanical Grating Device," chemical mechanical planarization can be used to advantageously accomplish the requirements of such a device namely; all the beams to have an optically flat surface, the same cross-section and a well defined beam to substrate distance, elimination of surface topography resulting in higher photo and dry etch yields as well as removing step coverage concerns.

Chemical mechanical polishing (CMP) has become a key technology as currently practiced in the semiconductor art for the planarization of metals and dielectrics and as taught in numerous U.S. patents such as that by Chow et al., U.S. Pat. No. 4,789,648, Carr et al., U.S. Pat. No. 4,954,142, and Beyer et al., U.S. Pat. No. 4,944,836. CMP provides full wafer planarization without additional masking or coating steps.

The use of CMP is also disclosed in U.S. Pat. No. 5,804,084, issued Sep. 8, 1998 to Nasby et al., entitled "Use of Chemical Mechanical Polishing In Micromachining". The process suggested therein is for removing topography effects during fabrication of micromachines. A sacrificial oxide layer is deposited over a level containing functional elements (driving gear, liquid pump, etc.) with etched valleys between the elements such that the sacrificial layer has sufficient thickness to fill the valleys and extend thickness upwards to an extent that the lowest point on the upper surface of the oxide layer is at least as high as the top surface of the functional elements in the covered level. The sacrificial oxide layer is then polished down and planarized by CMP. Another level of functional elements is formed upon the new planarized surface. The teaching of his document does not provide a technique or a method how to get coplanar surfaces with the a CMP method. U.S. Pat. No. 5,804,084 shows only a method which can bring a plurality of islands existing in one layer to a single level. There is no need to consider a dishing effect which happens during the production of two coplanar surfaces.

However many of the micromachined structures typically fall into the regime of wide (>10 $\mu$m wide) recesses and sparsely populated structures. One of the difficulties encountered with CMP planarization is the "dishing" effect, which occurs in the planarization of wide recesses (i.e., usually >10 $\mu$m wide). The "dishing" effect during planarization results in thinning of the overfill layer in wide recesses resulting in a non-planar surface. The polish rate is affected by the topology of the surrounding areas with dishing becoming worse in sparsely populated regions. Dishing problems therefore present a severe manufacturing constraint in micromachining.

Figure 1A:
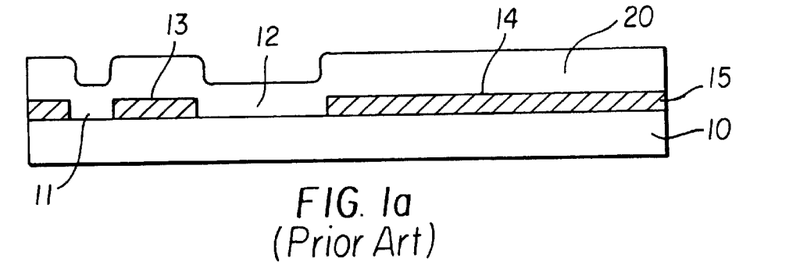
FIG. 1a–1b show the dishing phenomenon reference to the schematic cross-sectional views of multilayered structures.
Figure 1B:
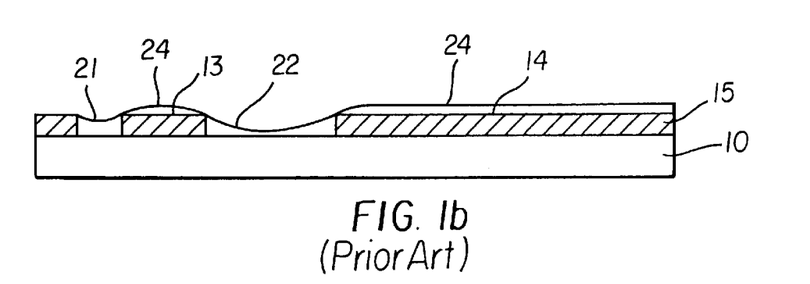

The dishing phenomenon is illustrated by reference to the schematic cross-sectional diagrams of FIG. 1a and FIG. 1b. Shown in FIG. 1a is a substrate 10 onto which a first layer 15 is deposited. A narrow recess 11 and the wide recess 12 are shown formed in the first layer 15. The surface of the first layer will contain small areas 13 between recesses and large areas 14 between recesses. Deposited over the first layer 15 and into both the narrow recess 11 and the wide recess 12 is a blanket conformal fill layer 20. Shown in FIG. 1b is the results of planarizing through a conventional CMP planarization method the blanket conformal fill layer 20 as illustrated in FIG. 1a. As shown in FIG. 1b, the surface of the planarized filled recess 22 is substantially dished in comparison with the surface of planarized filled recess 21. There is also shown in FIG. 1b the presence of a fill residue layer 24 formed simultaneously over the small areas 13 and large areas 14 on the surface of the first layer 15 when the blanket conformal fill layer 20 is planarized through the CMP planarization method to form the planarized filled recesses 21 and 22. As is understood by a person skilled in the art, when planarizing large areas of the blanket conformal fill layer 20, generally of dimensions greater than about 1000 microns, the blanket conformal fill layer 20 will in addition to planarizing more rapidly over the wide recess 12 and forming a dish within the planarized filled recess 22 simultaneously also polish more slowly over the large area 14 on the surface of the first layer 15 and leave the fill residue layer 24 formed over the large area 14 on the first layer 15. Attempts to remove the fill residue layer 24 by further planarization will cause increased dishing of the planarized filled recesses 21 and 22. Fill residue layers such as the fill residue layer 24 are undesirable since they impede further device processing on the planarized surface.

A method to limit dishing is used in U.S. Pat. No. 5,721,172, issued Feb. 24, 1998, to Jang et al., entitled, "Self-Aligned Polish Stop Layer Hard Masking Method For Forming Planarized Aperture Fill Layers". A conformal polish stop layer is formed on top of the conformal fill layer. The conformal polish stop layer and the conformal aperture fill layer are then planarized through a first CMP planarization method until there is reached the lower planar region of the conformal polish stop layer, while simultaneously forming a patterned polish stop layer and a partially CMP planarized aperture fill layer. The patterned polish stop layer is then employed as a etch mask to form an etched partially CMP planarized aperture fill layer with a protrusion over the aperture, where the height of the protrusion compensates for a dish which would otherwise form when the etched partially CMP planarized aperture fill layer is planarized through a second CMP method to form a planarized aperture fill layer within the aperture. The teaching of this document requires a complicated process involving the deposition of an extra layer and two separate CMP planarization steps. The method of CMP in this teaching also requires relatively low selectivity between the fill layer and the polish etch stop layer. Therefore the polish etch stop layer final thickness is not well controlled.

An Article by B. H. Roh et al. entitled "Easily Manufacturable Shallow Trench Isolation for Gigabit Dynamic Random Access Memory", Jpn. J. Appl. Phys. Pt. 1,Vol.35 (1996), pp.1618–4623 describes a method to limit the dishing phenomenon in shallow trench isolation techniques. The oxide isolation layer is partially etched on a semiconductor active region prior to performing a planarization step. The result of this method is a planarized oxide surface. There is no need to create coplanar surfaces between a first layer and a second layer.

SUMMARY OF THE INVENTION

It is an object of the present invention to provide a coplanar surface between at least two different materials by minimizing the dishing effect while ensuring complete removal of the fill material outside of the critical areas. Furthermore, the coplanarity of the surface is necessary in order to allow the formation of additional structures which require the flatness of the surface on which they are grown or built.

The object is achieved by a method comprising the steps of:
  a) providing a first layer with at least one recess wherein said recess has a depth defined by the thickness of the first layer;
  b) depositing a second layer over the entire area of the first layer wherein the second layer has a thickness greater than the depth of the recess and is composed of a differing material to the first layer;
  c) removing the second layer completely beyond the area of at least one recess; and
  d) removing the remaining portion of the second layer until the second layer is coplanar with the first layer.

The object is also achieved by a method comprising the steps of:
  a) providing a first layer with at least one recess wherein said recess has a depth defined by the thickness of the first layer;
  b) depositing a second layer over the entire area of the first layer wherein the second layer has a thickness greater than the depth of the recess, thereby providing a conformed recess in the second layer defining a ground level, said second layer is composed of a differing material to the first layer;
  c) removing partially the second layer beyond the area of at least one recess until a surface level defined by the partially removed second layer matches the ground level; and
  d) removing the remaining portion of the second layer until the second layer is coplanar with the first layer.

An advantage of the inventive method is that the fill material outside the critical area is completely removed to ensure no residual fill material on that surface. The height differential between the pattern area and adjacent regions remains but the high points are a very small fraction of the total surface area being polished. The mechanical effect of the polish will be a more rapid removal of material from these non-critical areas. The total area affected by CMP is more uniform and the result in the pattern area is a more planar surface. The extent of coverage outside the pattern area may vary but need not extend much more than the alignment tolerance of the exposure unit used to pattern the fill layer.

BRIEF DESCRIPTION OF THE DRAWINGS

The subject matter of the invention is described with reference to the embodiments shown in the drawing.

FIG. 8 shows a profilometer trace after the etching of the second layer as disclosed in FIG. 3a;

FIG. 9 shows a profilometer trace after the CPM process of the second layer as disclosed in FIG. 3a;

FIG. 10 shows a profilometer trace after the CPM process without the patterning as disclosed in FIG. 3a;

DETAILED DESCRIPTION OF THE INVENTION

Referring to FIGS. 2 through 7 which are perspective descriptions of the inventive method for producing at least one coplanar surface. The following description is limited to a device which has a limited number of recesses. It is clear for any skilled person that the inventive method is not limited to the embodiments disclosed in the specification. According to FIG. 2, a first layer 26 is provided on a substrate 28 which has a first and a second recess 30 and 32 formed therein. The recesses 30 and 32 have a width W and a height H which is determined by the thickness of the first layer 26. The first and second recess 30 and 32 have a length which extends along the longitudinal axis of the substrate 28. The longitudinal direction of the substrate 28 is marked by an arrow L—L. On top of the first layer 26 a second layer 34 conformed to the first layer 26 is provided. The thickness of the second layer 34 is at least of the height H of the first or second recess 30 or 32. The applied second layer 34 defines a conformed recess 35 at the same location as the first and second recesses 30 and 32 in the first layer 26. Each conformed recess 35 in the second layer 34 defines a ground level 35a. The material used for the second layer 34 has to be different from the material of the first layer. FIG. 3a shows a first embodiment of the present invention. The second layer 34 is removed completely except for an area beyond at least one recess 30 or 32 (here recess 30). The selective removal of the second layer 34 is carried out by an appropriate patterning process which is, for example, followed by an etching step. The removal of the second layer 34 exposes a top surface 36 of the first layer 26. How much material of a second remaining layer 34a extends beyond the recess 30 has to be adjusted to the setup parameters (pressure, slurry used, speed, etc.) of a CMP device (not shown). The width of the remaining second layer 34a has to have at least the width W of the recess 30. As mentioned above the device (as shown in FIG. 3a) is then subjected to a removing process of the remaining second layer 34a. The removing process used here is CMP. The removing process (see FIG. 4) lasts until only the first recess is filled with the material of the remaining second layer 34a. The second remaining layer 34a, filling the first recess 30, defines a surface 36a which is coplanar with the surface 36 of the first layer 26. In a second embodiment, a shown in FIG. 3b, the second layer 34 is not removed completely from the area beyond at least one recess 30 or 32. The second layer 34 is removed form the area beyond recess 30 to such an extent that still material of the second layer 34 covers the first layer 26. The selective removal of the second layer 34 is carried out by an appropriate patterning process, which is, for example, followed by an etching step thereby defining a surface level 37a. The removal of the second layer 34 is stopped when the surface level 37a is coplanar with ground level 35a of the recess 35 of the remaining second layer 34a after partial removal of the second layer 34. As mentioned already with the first embodiment (FIG. 3a), the material used for the second layer 34 has to be different from the material of the first layer 26. The pattern, as shown in FIG. 3b, is then subjected to the CMP. The removing process lasts until only the first and the second recess 30 and 32 are filled with the material of the remaining second layer 34. The following description of the process is limited to the first embodiment (see FIG. 3b).

Figure 5:
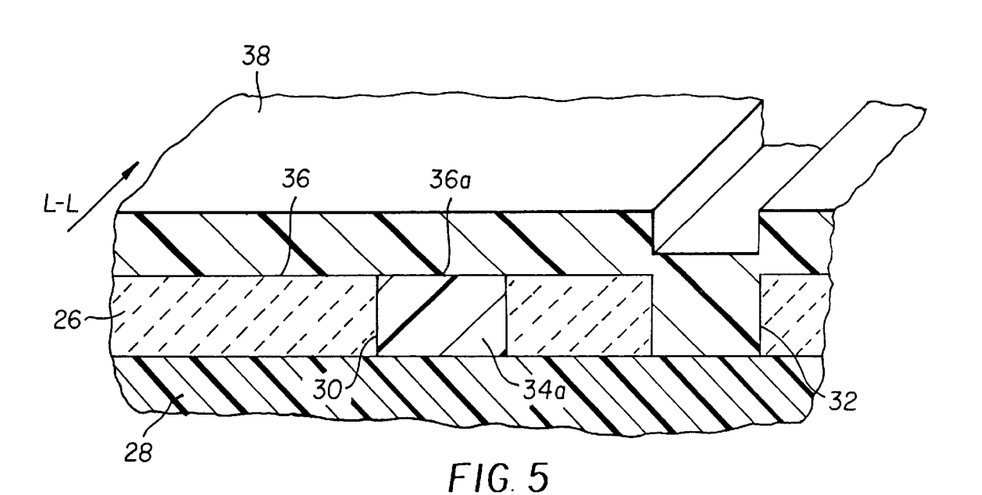
FIG. 5 is a partial perspective description of the method for producing coplanar surfaces, wherein a second fill material is applied to the first layer.
Figure 6:
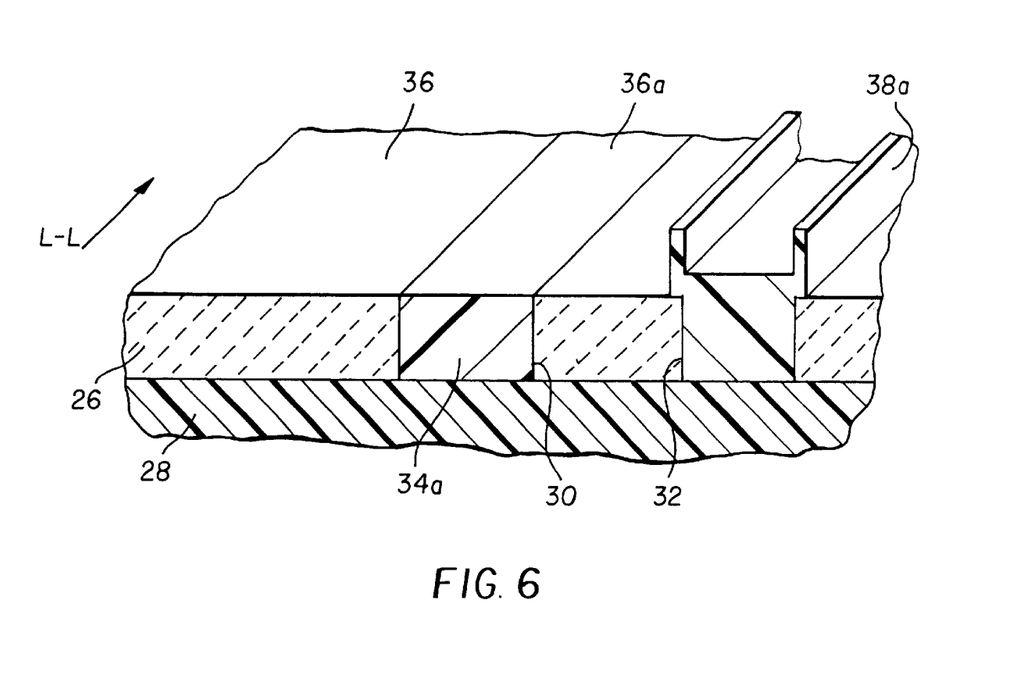
FIG. 6 is a partial perspective description of the method for producing coplanar surfaces, wherein the second fill material is partially etched.

Referring now to FIG. 5 an additional second layer 38 is applied on top of the first layer 24, thereby covering the surface 36 of the first layer 24 and the surface 16a of the remaining second layer 34a in the first recess 30. As mentioned above, the thickness of the additional second layer 38 is at least of the height H of the second recess 32. The material used for the additional second layer 38 has to be different from the material of the first layer 26. The material for the additional second layer 38 differs from the material of the remaining second layer 34a. The next process step is similar to the process step as disclose in FIG. 3a. Now in FIG. 6 the additional second layer 38 is removed. In the present embodiment the additional second layer 38 is not removed from the area beyond the second recess 32. The selective removal of the additional second layer 38 is carried out by an appropriate patterning process which is, for example, followed by an etching step. The removal of the additional second layer 38 exposes again the top surface 36 of the first layer 26 and the top surface 36a of the remaining second layer 34a in the first recess 30. How much material of a remaining additional layer 38a extends beyond the recess 32 has to be adjusted to the setup parameters (pressure, slurry used, speed, etc.) of a chemical mechanical planarizing device (not shown). The removing process of the remaining additional second layer 38a is done with CMP. The removing process (see FIG. 7) lasts until only the material of the remaining additional second layer 38a defines a surface 36b which is coplanar with the surface 36 of the first layer 26 and surface 36a of the remaining second layer 36b in the first recess 30.

It is clear for a skilled person that the described method may be carried out with a plurality of recesses. Therefore, the embodiments described in the specification should not be regarded as a limitation of the scope of the invention.

Figure 2:
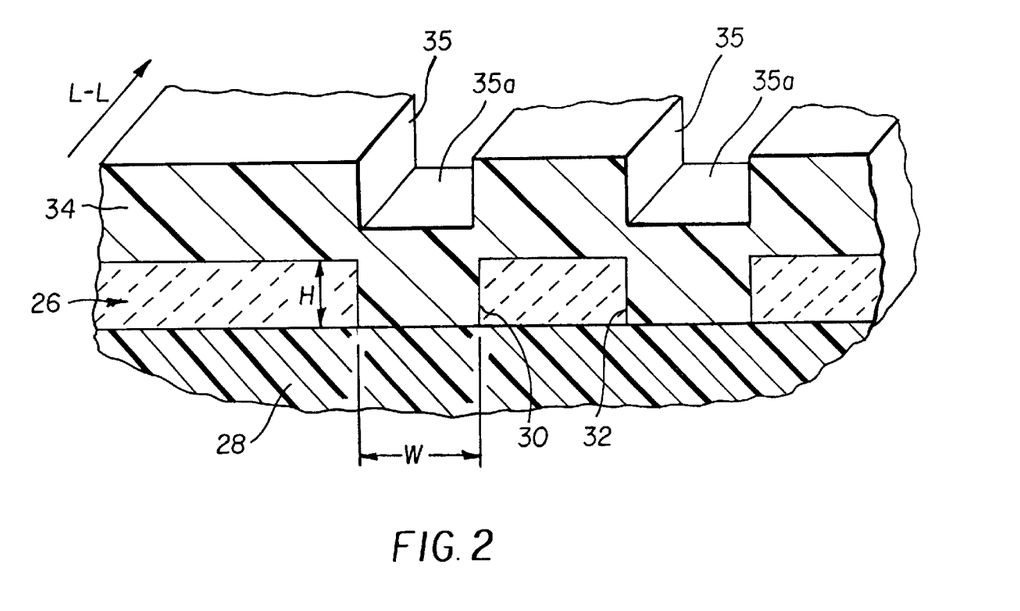
FIG. 2 is a partial perspective description of the method for producing coplanar surfaces, wherein a first fill material is applied to the first layer.
Figure 3A:
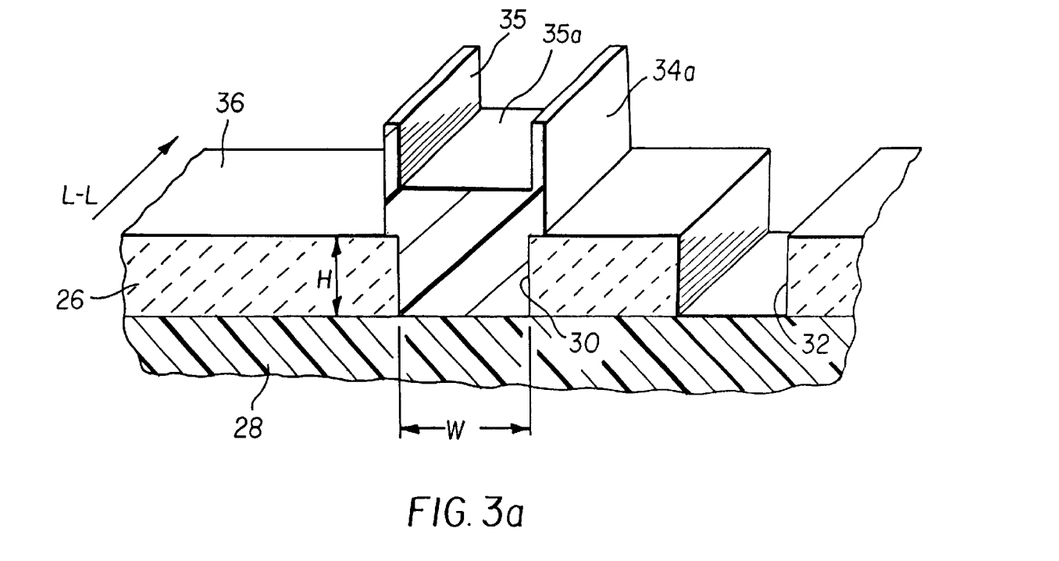
FIG. 3a is a partial perspective description of the method for producing coplanar surfaces, wherein the fill material is partially etched.
Figure 3B:
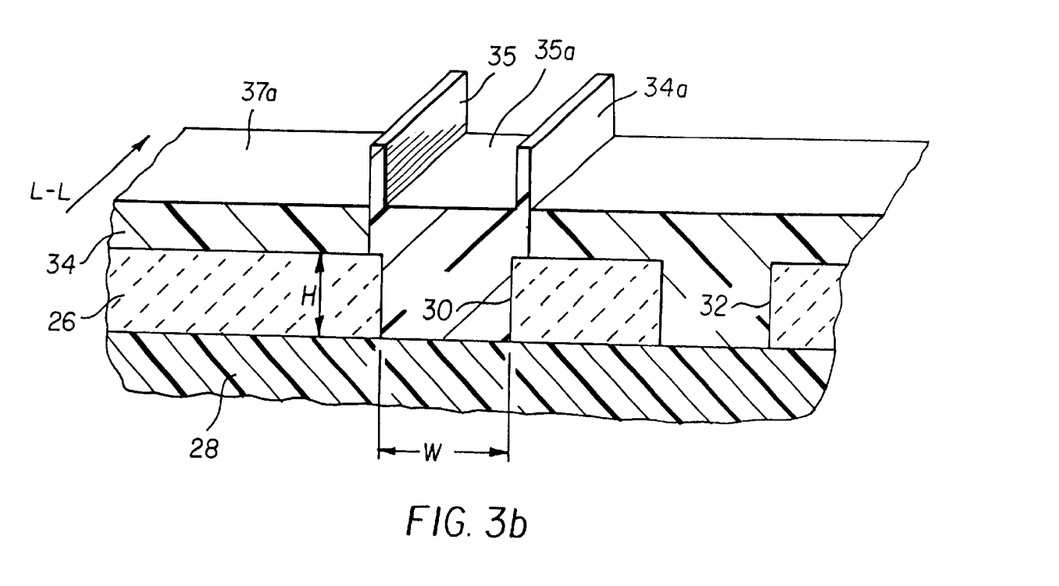
FIG. 3b is a partial perspective description of another embodiment of the method for producing coplanar surfaces, wherein the fill material is partially etched but not removed completely from the area beyond the recess.
Figure 4:
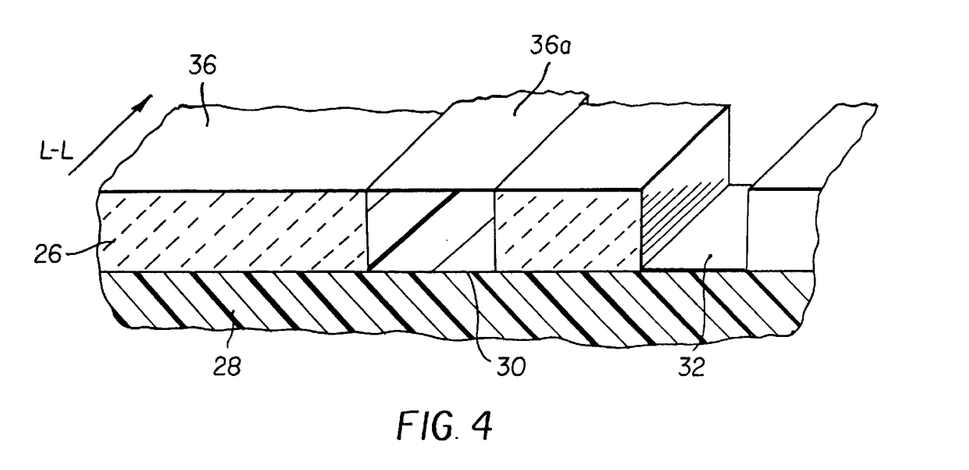
FIG. 4 is a partial perspective description showing the finished coplanar surfaces.
Figure 8:
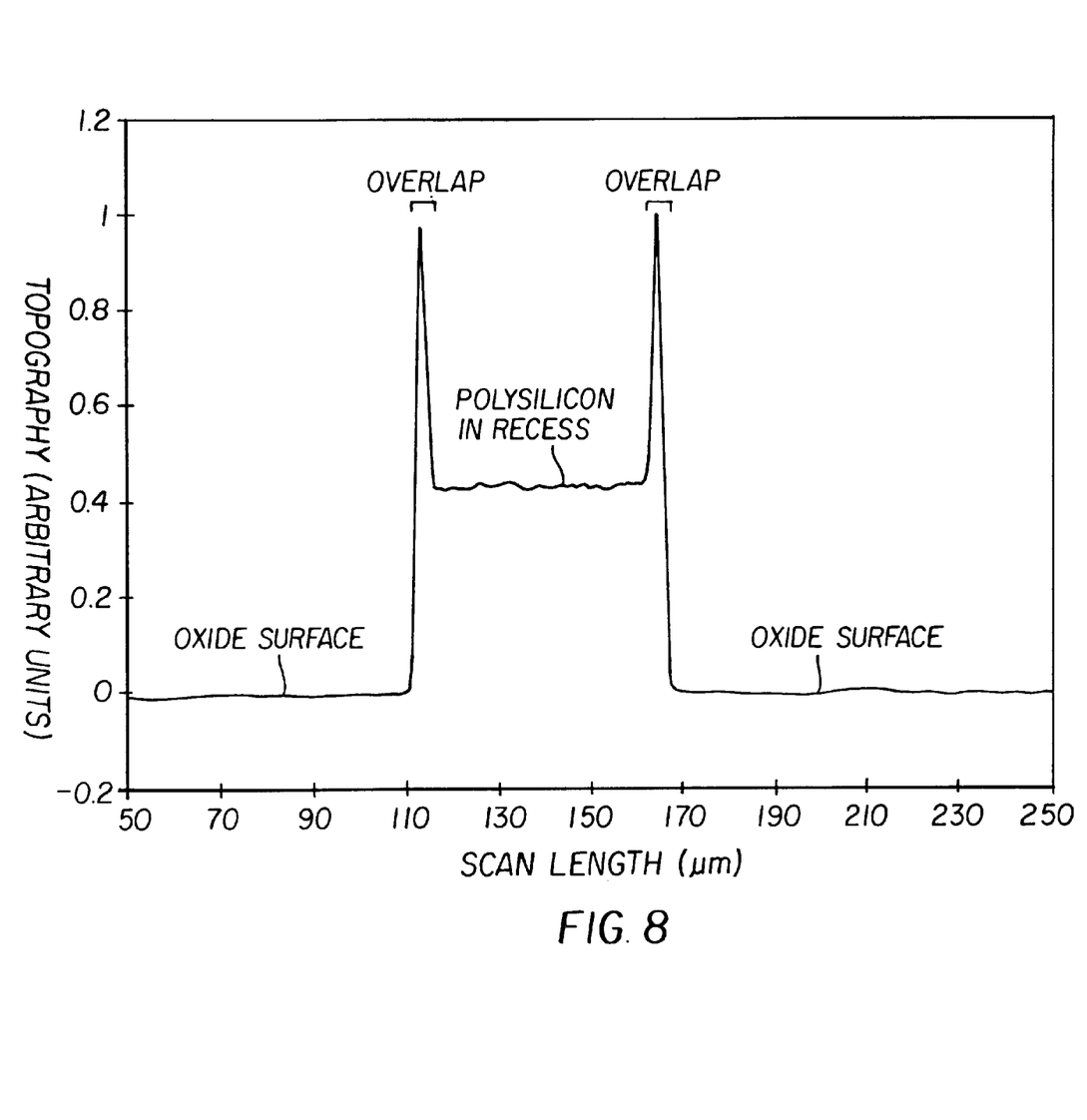
Figure 9:
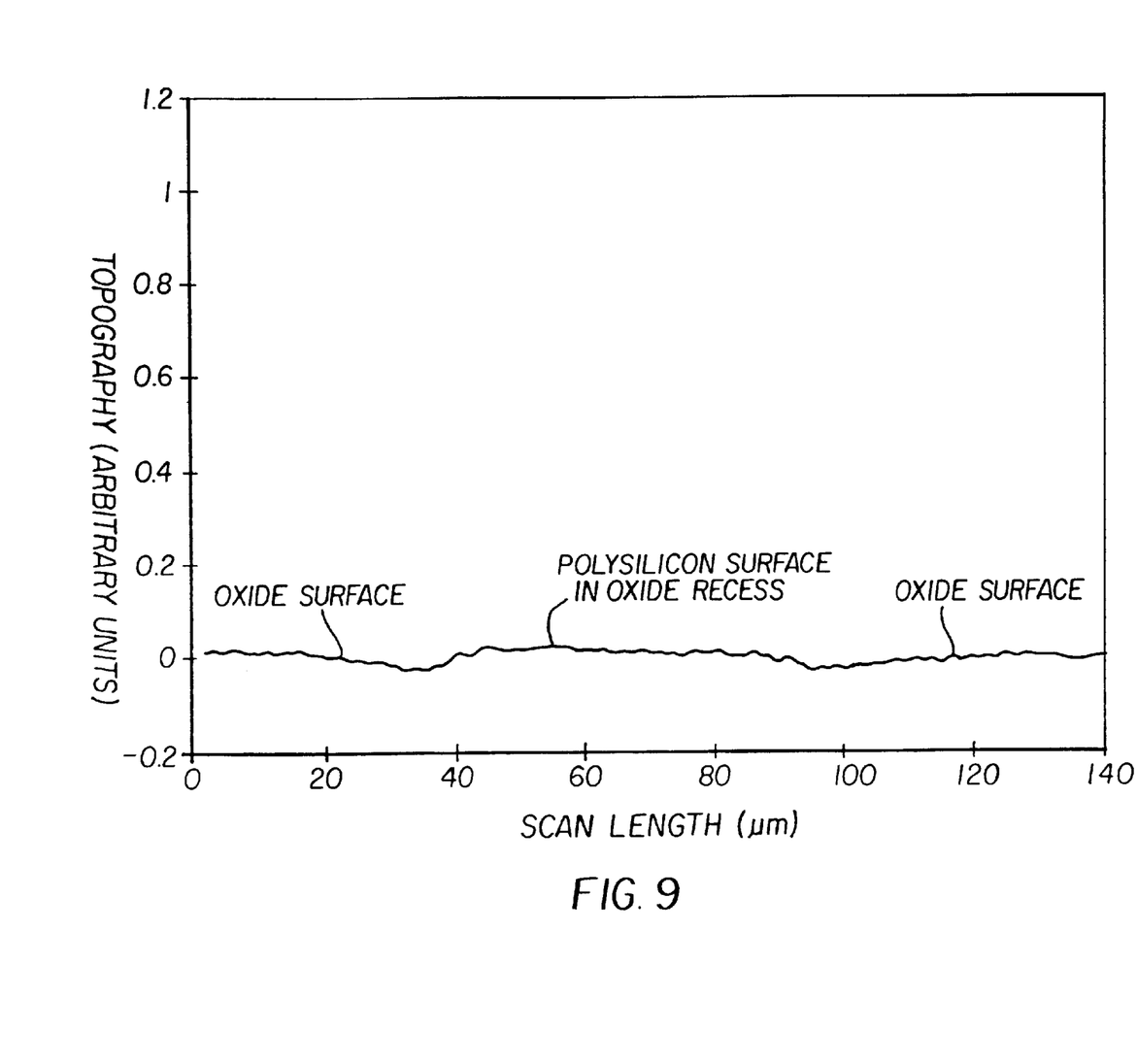
Figure 10:
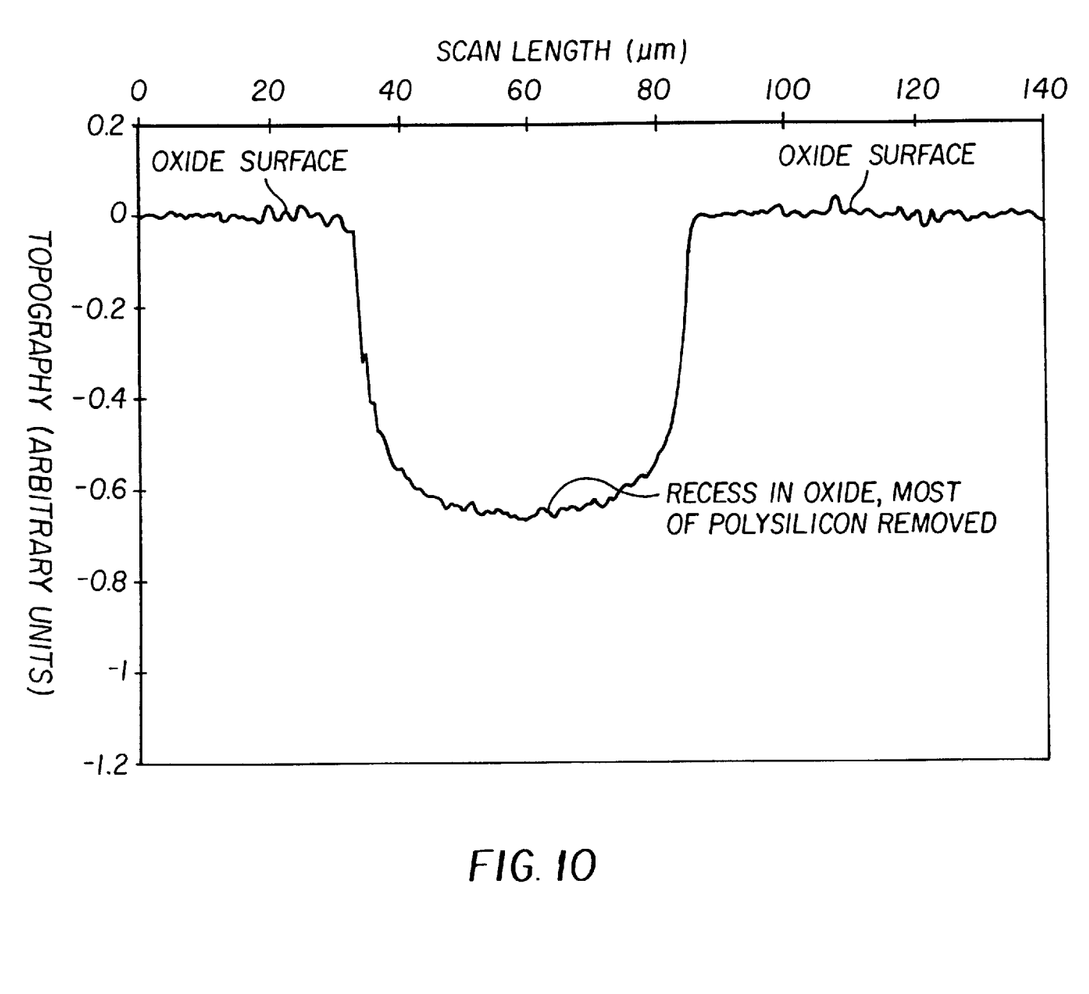

FIGS. 8–10 show the improvement of surface quality achieved with the inventive method. The topography in FIGS. 8–10 is in arbitrary units. The layer structure, used for the topography results, is comparable to the structure as shown in FIG. 2 and 3a. A first layer 26 of thermally grown silicon dioxide is applied to the substrate 28 and etched to define a 50 μm wide recess 30. A second layer 34 consisting of polysilicon is then deposited. A Photoresist is patterned over the polysilicon to serve as an etch mask. The polysilicon is etched away defining a silicon dioxide surface 36 everywhere except in the recess 30 including 2 microns of remaining second layer 34a overlap between the polysilicon and silicon dioxide around the recess 30. FIG. 8 shows a surface profilometer trace of such a feature after the photoresist etch mask is removed.

The substrates proceed through CMP, which reduces the polysilicon height to match that of the silicon dioxide first layer 26. The removal rate of the polysilicon is much greater than the silicon dioxide removal rate, therefore, little oxide is lost; less than 50 Å. The removal rate of the polysilicon on the overlap regions is higher than in the recess regions resulting in a planar polysilicon surface that is coplanar with the silicon dioxide surface. Since the polysilicon was previously etched away in all other regions of the silicon dioxide, the purpose of the CMP process is limited to just planarizing the recess areas and not clearing the polysilicon off the silicon dioxide surface. FIG. 9 shows the surface topography around a 50 μm wide recess after CMP. Without patterning the polysilicon first, heavy dishing results as illustrated in FIG. 10. The processing for both examples included Rodel SDE3000 slurry, Rodel IC1000 pad with a SubaIV subpad on a Strasbaugh 6DS-SP CMP tool. The CMP conditions included a table speed of 55 rpm, spindle speed of 50 rpm, down pressure of 3 PSI, and table temperature of 25° C. It is clear for a skilled person that variations and modifications of the CMP conditions be effected.

The following part of the specification shows the use of the inventive method to provide coplanar surfaces which are important for the construction of additional elements. The method should be further discussed with respect to a mechanical grating device 100.

Figure 7:
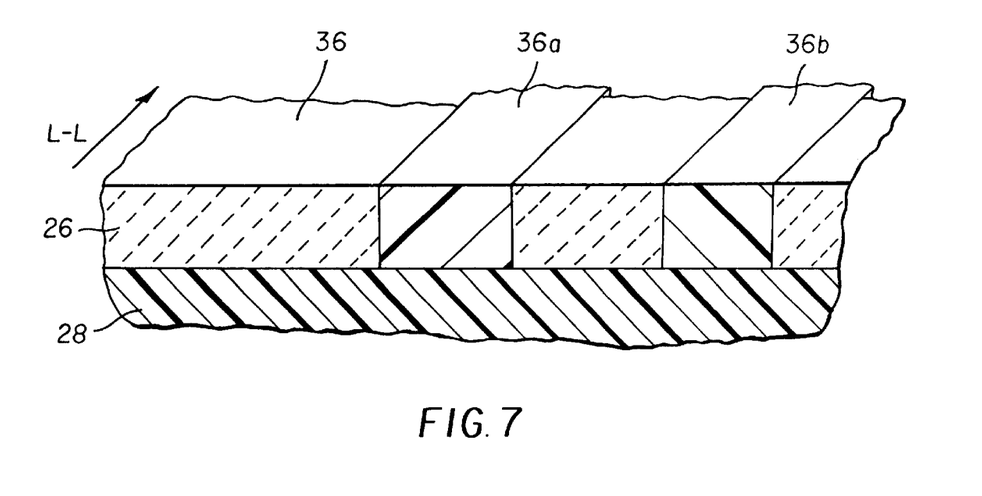
FIG. 7 is a partial perspective description showing the finished coplanar surfaces.
Figure 11:
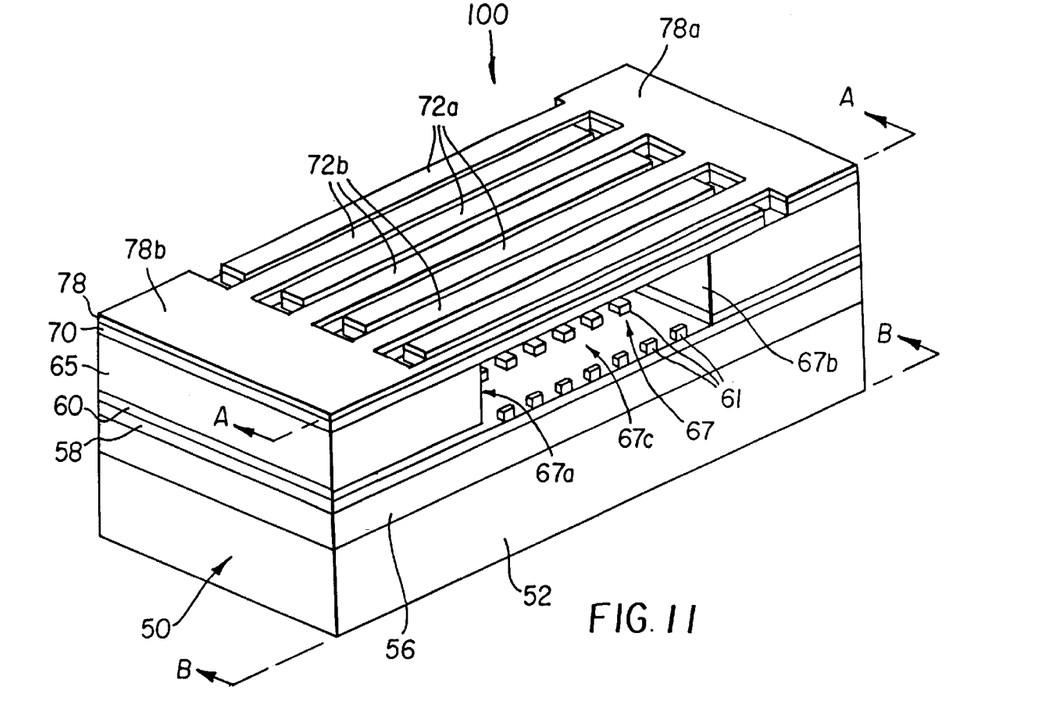
FIG. 11 perspective, partially cut-away view of the mechanical grating device which incorporates the invention of producing coplanar surfaces.

FIG. 11 is a perspective, partially cut-away view of the mechanical grating device 100 of the present invention. The mechanically deformable structures of the mechanical grating device 100 are formed on top of a base 50. The present embodiment as shown in FIG. 7 discloses a mechanical grating device 100 which can be operated by the application of an electrostatic force. According to the fact that the actuation force of the mechanical gating device 100 is electrostatic, the base 50 comprises the several layers of different materials. The base 50 comprises a substrate 52. The material of the substrate 52 is chosen from the materials glass, plastic, metal and semiconductor materials. The substrate is covered by a bottom conductive layer 56. In this embodiment the thin bottom conductive layer 56 is necessary since it acts as an electrode for applying the voltage to actuate the mechanical grating device 100. The thin bottom conductive layer 56 is covered by a protective layer 58. The bottom conductive layer 56 is selected from the group consisting of aluminum, titanium, gold, silver, tungsten, silicon alloys, and indium tinoxide. Above the protective layer 58, a standoff layer 60 is formed which is followed by a spacer layer 65. On top of the spacer layer 65 a ribbon layer 70 is formed which is covered by a reflective layer 78. In the present embodiment the reflective layer 78 has also to be conductive in order to provide electrodes for the actuation of the mechanical grating device 100. The electrodes are patterned from the reflective and conductive layer 78.

The spacer layer 65 has a longitudinal channel 67 formed therein. The longitudinal channel 67 comprises a first and second side wall 67a and 67b and a bottom 67c. The channel 67 is open to the top and covered by a first and a second set of deformable ribbon elements 72a and 72b. Each deformable ribbon element 72a and 72b spans the channel 67 and is secured to the surface of the spacer layer 65 on either side of the channel 67. The bottom 67c of the channel 67 is covered by a protective layer 58. As mentioned above, the ribbon layer 70 is covered by the reflective layer 78. The reflective layer 78 (conductive) is patterned such that there is a first and a second conducting region 78a and 78b. Both, the first and the second conductive region 78a and 78b have according to the patterning, a comb-like structure and are arranged at the surface of the mechanical grating 100 device in a inter-digitated manner. The first and second conductive region 78a and 78b are mechanically and electrically isolated from one another. According to the pattern of the reflective layer 78 the ribbon layer 70 is patterned in the same manner. As a result there are the first and the second set of deformable ribbon elements 72a and 72b spanning the channel 67 and in the direction of the channel 67 are arranged such that every other deformable ribbon element belongs to one set. Furthermore, the deformable ribbon elements 72a and 72b define a top surface 70a and a bottom surface 70b. It is important for the efficiency of the mechanical grating device that the top surface 70a and the bottom surface 70b of all deformable ribbon elements are coplanar.

In the embodiment as shown in FIG. 111 a plurality of standoffs 61 are positioned on the bottom 67c of the channel 67. The standoffs 61 are patterned from the standoff layer 60 such that a group of standoffs 61 is associated only with the deformable ribbon elements 72a and 72b of the first or the second set. In the embodiment shown here, the group of standoffs 61 is associated with the second set of deformable ribbon elements 72b. The standoffs 61 may also be patterned in the form of a single bar.

Figure 12:
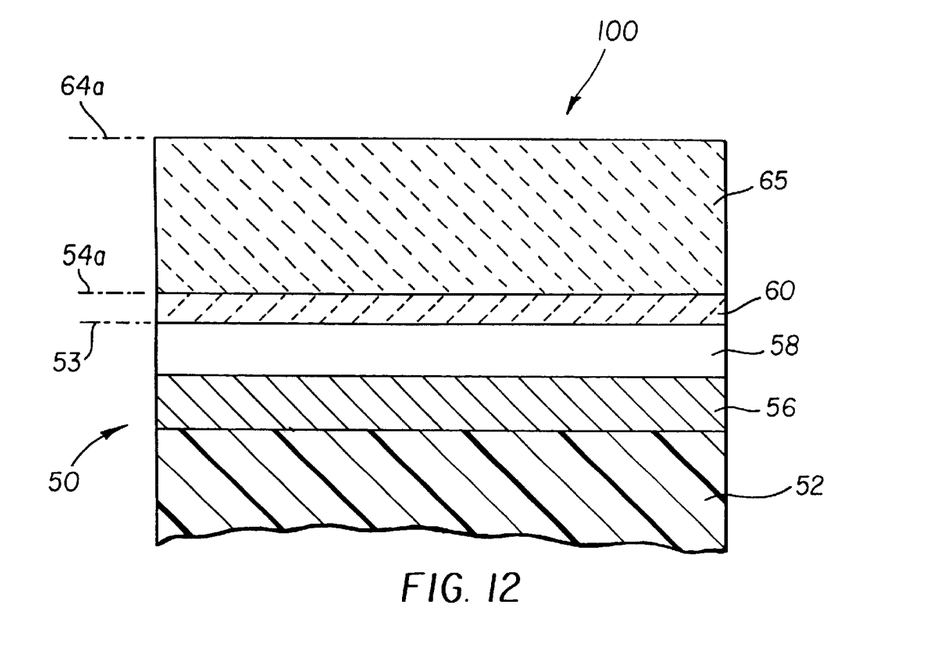
FIG. 12 is a cross-sectional view along a plane determined by the lines A—A and B—B as indicated in FIG. 11 to illustrate the layer built-up of one embodiment of the invention utilizing coplanar surfaces.

Referring to FIG. 12, the mechanical grating device 100 (the following description is limited to an electromechanical device) is fabricated using standard microelectronic thin-film processing, the substrate 52 is a single crystal silicon wafer. Although the silicon is a conducting material, ion implantation can be used to increase the conductivity near a surface 53 defined by the base 50 confinement within the base 50. The implantation results in a highly conducting thin region 56 designated as the ground plane of the electrical circuit (not shown) at the surface 53 of the base 50. The protective layer 58 of thermal oxide is grown at the surface 53 of the base 50. Next, a standoff layer 60 of silicon nitride is deposited. The standoff layer 60 defines an upper surface 54a which will be used to define an actuation height resulting from the operation of the mechanical device 100. Next, a spacer layer 65 of silicon oxide deposited by chemical vapor deposition is added. The total height of the actuation is defined by the thickness of the spacer layer 65 having an upper surface level 64a.

Figure 13:
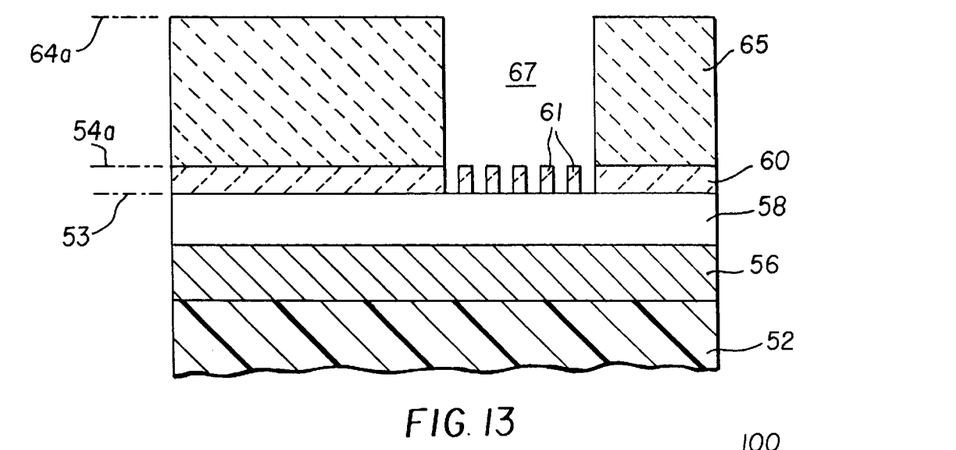
FIG. 13 is a cross-sectional view along a plane determined by the lines A—A and B—B as indicated in FIG. 11 to illustrate the plane A—A indicated in FIG. 3 to illustrate etching of a channel.

The next step is illustrated in FIG. 13, showing the patterning of the spacer layer 65 using standard photolithographic processing and etching methods to define the channel 67 where the active region of the mechanical device 100 will be located. The standoff layer 60 is then patterned using photolithographic processing and etching methods to produce silicon nitride standoffs 61, as illustrated in FIG. 13. Although not illustrated, these patterns can consist of pedestals or lines. The standoffs 61 act as mechanical stops for the actuation of the device and the upper surface of the standoffs 61 is surface 54a.

Figure 14:
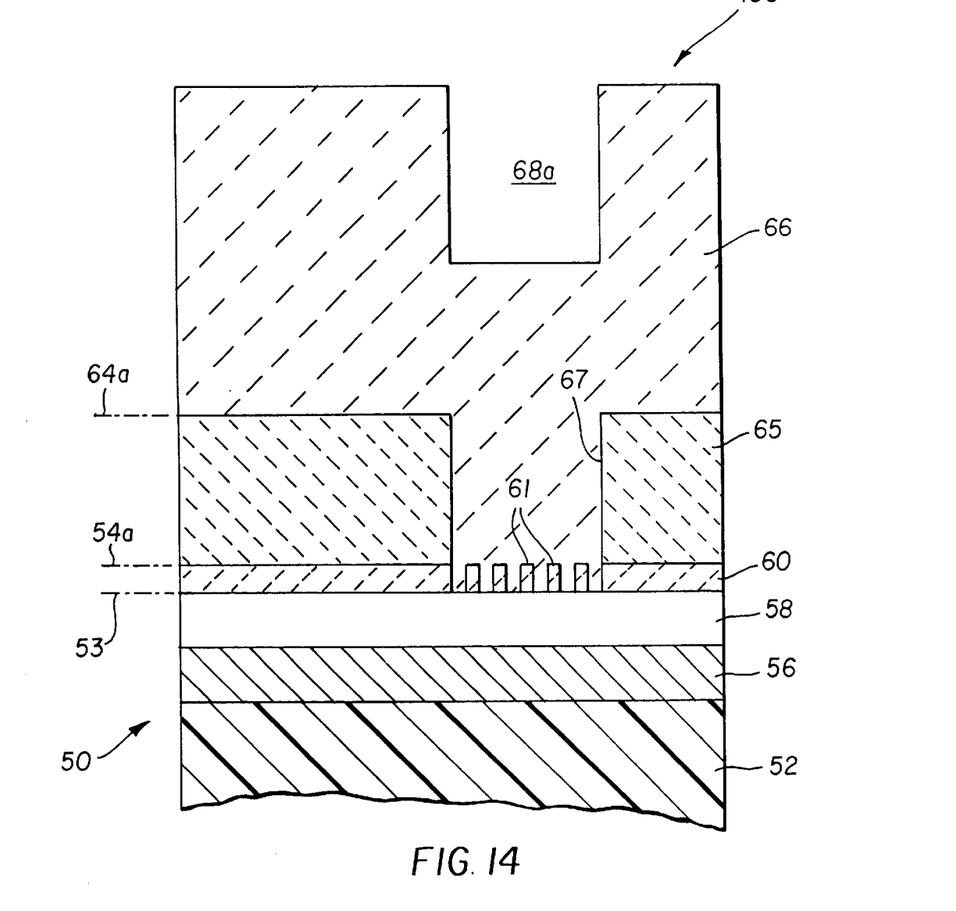
FIG. 14 is a cross-sectional view along a plane determined by the lines A—A and B—B as indicated in FIG. 11 to illustrate the deposition of a sacrificial layer.

To allow the additional layers atop the existing structure, a conformal sacrificial layer 66 of polycrystalline silicon is deposited to a thickness greater than the separation of surfaces 54a and 64a as illustrated in FIG. 14. The deposited sacrificial layer 66 shows a conform recess 68a in the area of the channel 67 which is located beneath the deposited sacrificial layer 66.

Figure 15:
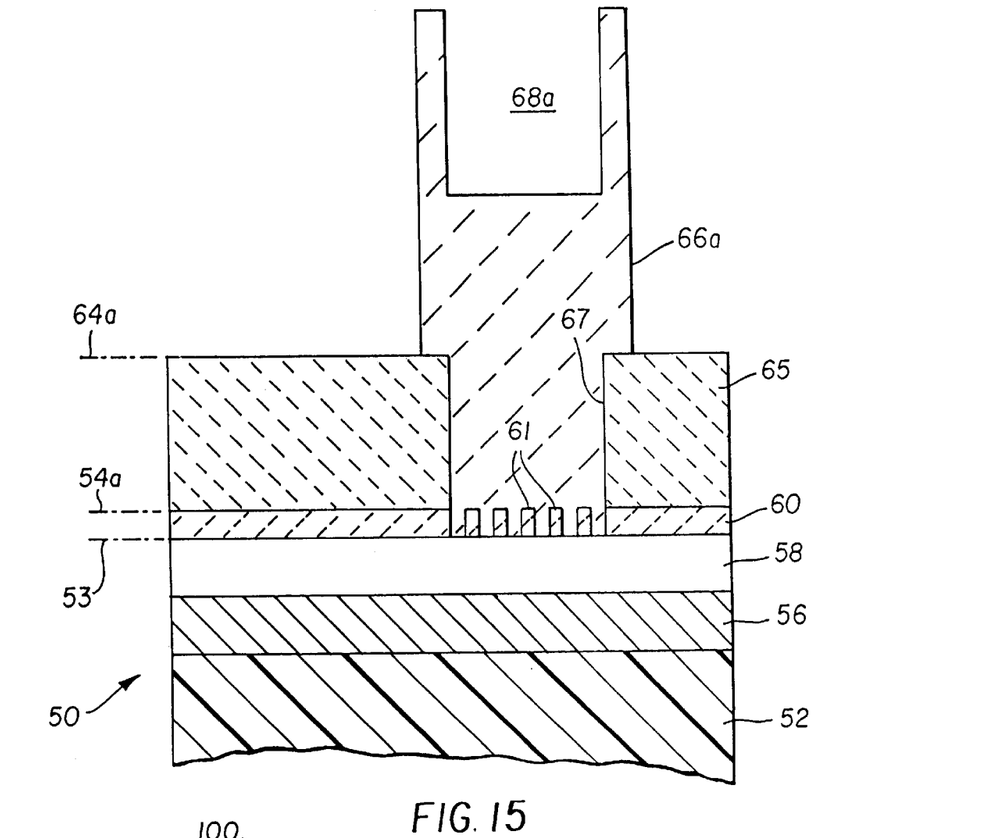
FIG. 15 is a cross-sectional view along a plane determined by the lines A—A and B—B as indicated in FIG. 11 to illustrate the patterning of the sacrificial layer exceeding area of the channel.

The next step, as illustrated in FIG. 15, is the removal of the sacrificial layer 66 from the device 100 completely except an area beyond the channel 67. The selective removal of the sacrificial layer 12 is carried out by an appropriate patterning process, which is, for example, followed by an etching step. The removal of the sacrificial layer 66 exposes a top surface 64 of the spacer layer 65. How much material of a remaining sacrificial layer 66a extends beyond the area of the channel 67 has to be adjusted to the setup parameters (pressure, slurry used, speed etc.) of a chemical mechanical polishing device (not shown). The width of the remaining sacrificial layer 66a has to have at least the width of the channel 67.

Figure 16:
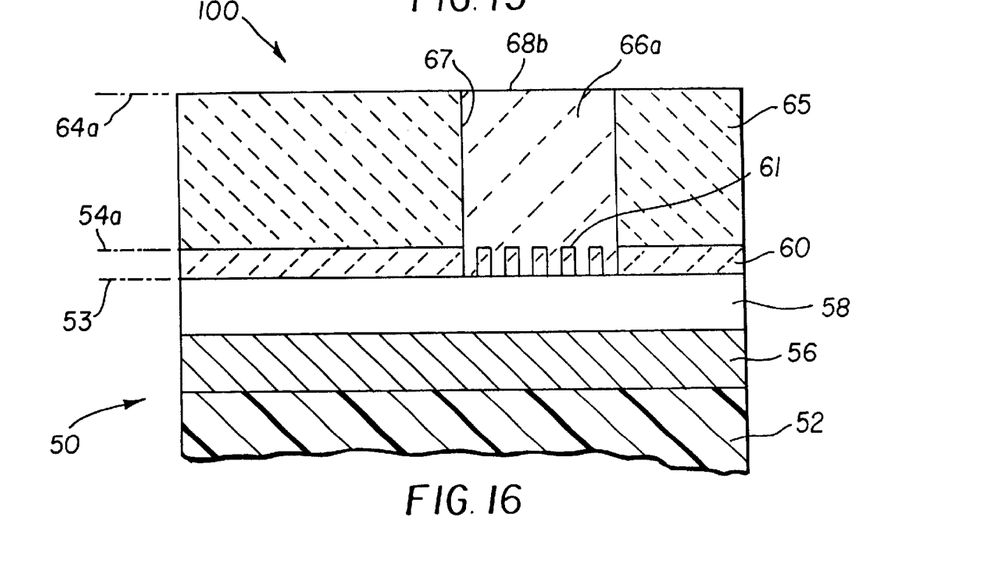
FIG. 16 is a cross-sectional view along a plane determined by the lines A—A and B—B as indicated in FIG. 11 to illustrate the coplanar surface according to the inventive method.

FIG. 16 illustrates the planarization of the remaining sacrificial layer 66a to a level substantially near the surface 64a using chemical mechanical polishing methods. The removing process (see FIG. 16) lasts until only the channel 67 is filled with the material of the remaining sacrificial layer 66a. The remaining sacrificial layer 66a, filling the channel 67, defines a surface 68b which is coplanar with the surface 64a of the spacer layer 65. The coplanar surface allows now the built up of further structures which have also well defined surfaces.

The invention has been described in detail with particular reference to certain preferred embodiments thereof, but it will be understood that variations and modifications can be effected within the spirit and scope of the invention.

PARTS LIST

| | |
|---|---|
| 10 | substrate |
| 11 | narrow recess |
| 12 | wide recess |
| 13 | small area between recesses |
| 14 | large area between recesses |
| 15 | first layer |
| 20 | blanket conformal fill layer |
| 21 | planarized filled narrow recess |
| 22 | planarized filled wide recess |
| 24 | fill residue layer |
| 26 | a first layer |
| 28 | substrate |
| 30 | first recess |
| 32 | second recess |
| 34 | second layer |
| 34a | remaining second layer |
| 35 | conformed recess |
| 35a | ground level |
| 36 | surface of the first layer |
| 36a | surface of the second layer in the recess |
| 36b | surface of the additional second layer in the recess |
| 37a | surface level |
| 38 | additional second layer |
| 38a | additional remaining second layer |
| 50 | base |
| 50a | top surface of base |
| 52 | substrate |
| 53 | surface of the base |
| 54a | top surface of standoffs |
| 54b | top surface of actuated ribbon elements |
| 56 | thin bottom conductive layer |
| 56b | surface of conductive layer |
| 58 | protective layer |
| 60 | standoff layer |
| 61 | standoff |
| 64a | coplanar surface |
| 65 | spacer layer |
| 66 | sacrificial layer |
| 66a | remaining sacrificial layer |
| 67 | channel |
| 67a | first side wall |
| 67b | second side wall |
| 67c | bottom |
| 68a | conform recess |
| 68b | surface of material in the channel |
| 70 | ribbon layer |
| 70a | top surface of the coplanar ribbon elements |
| 70b | bottom surface of the coplanar ribbon elements |
| 72a | first set of deformable ribbon elements |
| 72b | second set of deformable ribbon elements |
| 74 | opening |
| 75 | interconnection |
| 76 | thick conducting layer |
| 78a | first conducting region |
| 78b | second conducting region |

-continued

PARTS LIST

| | |
|---|---|
| 100 | mechanic grating device |
| A-A | first line defining a view plane |
| B-B | second line defining a view plane |
| L-L | longitudinal direction of the substrate |
| H | height of the recess |
| W | width of the recess |
| D | thickness of the ribbon layer |

What is claimed is:

1. A method for producing co-planar surface areas for micro-electromechanical systems structures comprising the steps of:

a) providing a first layer with at least two recesses over a substrate;

b) depositing a second layer over the entire area of the first layer wherein the second layer has a thickness greater than the depth of the recesses and is composed of a differing material to the first layer;

c) removing the second layer completely beyond the area of at least one recess;

d) removing the remaining portion of the second layer until the second layer is coplanar with the first layer; and e) repeating step b) trough d) with differing material until all the recesses provided by the first layer are coplanar with the first layer fro producing co-planar areas for micro-electromechanical systems structures.

2. The method as claimed in claim 1 wherein the removing of any second layer is done such that there is overlap of successive layer with the first layer beyond the recess.

3. The method as claimed in claim 2 wherein the overlap of any second layer with the first layer beyond the recess is in the range between 0.2 and 5 microns.

4. The method as claimed in claim 1 wherein the step of removing of any of the second layers comprises:

providing an etch mask to protect the material of the second layer within the area of the recess;

etching the area of the second layer unprotected by the etch mask to completely expose the first layer; and removing the etch mask.

5. The method as claimed in claim 1 wherein the step of removing the remaining portion of any of the second layer is provided by chemical-mechanical polishing.

6. The method as claimed in claim 1 wherein the step of removing the remaining portion of any of the second layer is provided by plasma etching.

* * * * *